(12) United States Patent
Srivastava et al.

(10) Patent No.: US 10,796,070 B2
(45) Date of Patent: Oct. 6, 2020

(54) LAYOUT PATTERN SIMILARITY DETERMINATION BASED ON BINARY TURNING FUNCTION SIGNATURES

(71) Applicant: Mentor Graphics Corporation, Wilsonville, OR (US)

(72) Inventors: Navin Srivastava, Beaverton, OR (US); Hanzhong Xu, Corvallis, OR (US); John Edward Hershberger, Portland, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/515,451

(22) Filed: Jul. 18, 2019

(65) Prior Publication Data
US 2020/0026820 A1  Jan. 23, 2020

Related U.S. Application Data

(60) Provisional application No. 62/700,680, filed on Jul. 19, 2018.

(51) Int. Cl.
*G06F 30/00* (2020.01)
*G06F 30/398* (2020.01)
*G06K 9/62* (2006.01)

(52) U.S. Cl.
CPC ......... *G06F 30/398* (2020.01); *G06K 9/6267* (2013.01)

(58) Field of Classification Search
CPC .... G06F 30/398; G06K 9/6267; G06K 9/481; G06K 9/6215
See application file for complete search history.

(56) References Cited

U.S. PATENT DOCUMENTS

| | | | | |
|---|---|---|---|---|
| 5,287,209 A | * | 2/1994 | Hiratsuka | H04N 1/4057 358/1.9 |
| 6,178,539 B1 | * | 1/2001 | Papadopoulou | G06F 30/39 716/122 |
| 7,020,335 B1 | * | 3/2006 | Abousleman | G06K 9/3241 375/240.11 |
| 7,301,676 B2 | * | 11/2007 | Usui | H04N 1/4055 358/3.13 |

(Continued)

OTHER PUBLICATIONS

Carlos F.S. Volotao et al., "Shape characterization with turning functions", 17th International Conference on Systems, Signals and Image Processing, 2010, pp. 1-4.

(Continued)

*Primary Examiner* — Naum Levin

(57) ABSTRACT

One or more binary turning function signatures for each of the layout patterns are determined. The one or more binary turning function signatures comprise binary turning function signatures for polygons in each of the layout patterns, and may further comprise binary turning function signatures for secondary polygons A binary turning function signature of a polygon is derived based on deriving a minimum binary number or a maximum binary number among variants of a binary turning function sequence number for the polygon. The variants are generated by circular bit shifting and bit sequence reversing. Similar layout patterns in the layout patterns are determined based on the one or more binary turning function signatures.

20 Claims, 17 Drawing Sheets

Flow chart
1100

(56) References Cited

U.S. PATENT DOCUMENTS

| | | | | |
|---|---|---|---|---|
| 8,611,700 B2* | 12/2013 | Kluzner | ................... | G06K 9/32 |
| | | | | 382/300 |
| 9,129,122 B2* | 9/2015 | Sakumoto | ............. | H04L 9/3252 |
| 9,965,848 B2* | 5/2018 | Banerjee | ............... | G06T 7/0006 |
| 2006/0235845 A1* | 10/2006 | Argentar | .............. | G06K 9/6267 |

OTHER PUBLICATIONS

J. P. Scanlan, "Sharp feature identification in a polygon", UNLV Theses, Dissertations, Professional Papers, and Capstones, 965 (2011), 50 pgs.

\* cited by examiner

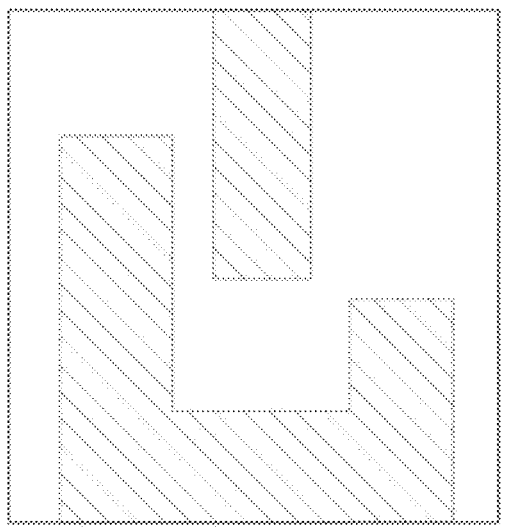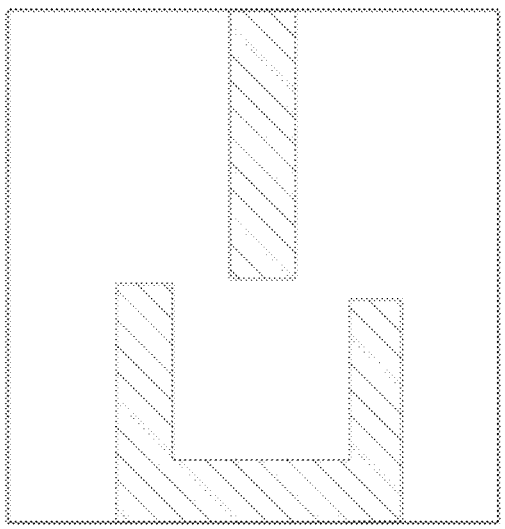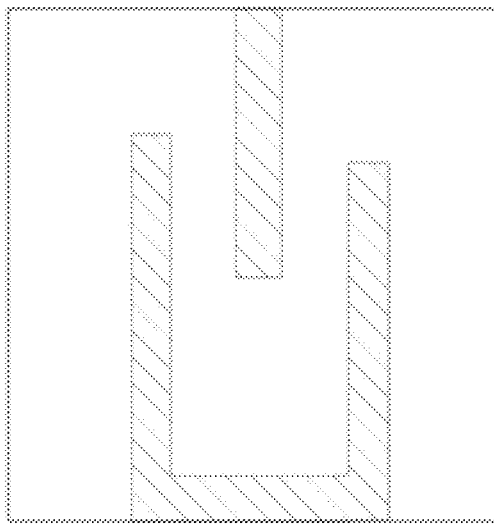
FIG. 3

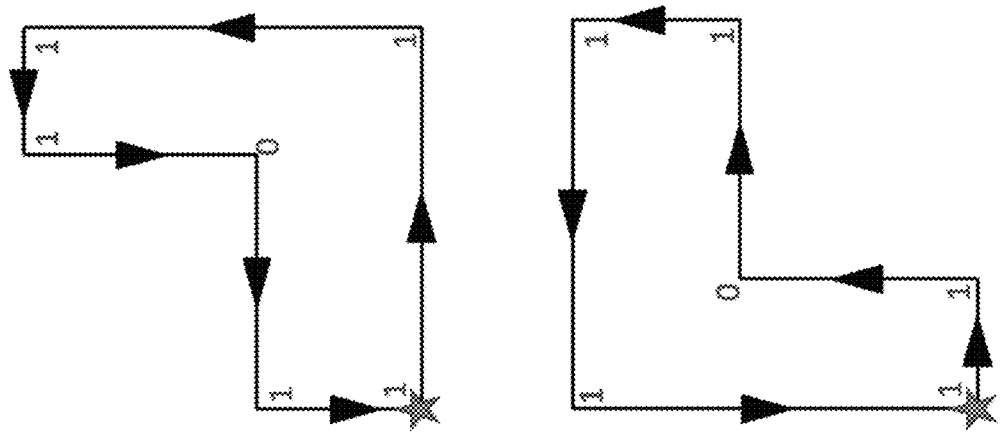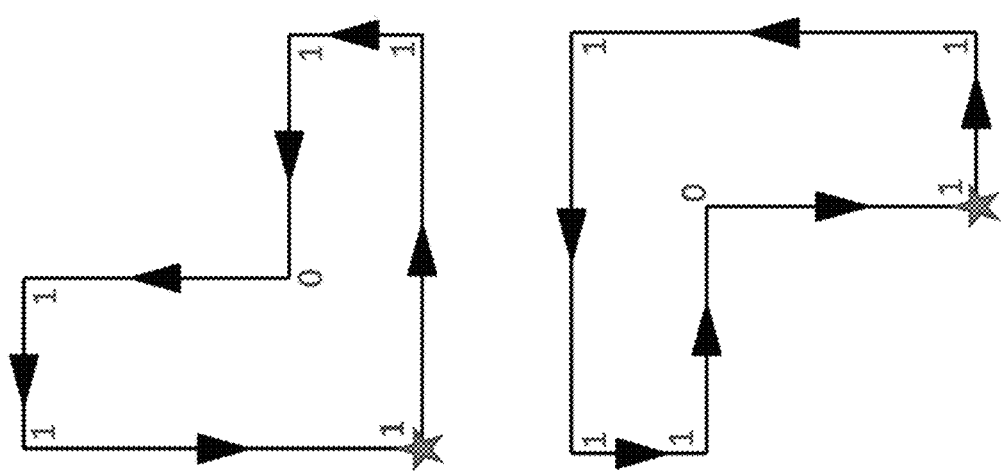
FIG. 5

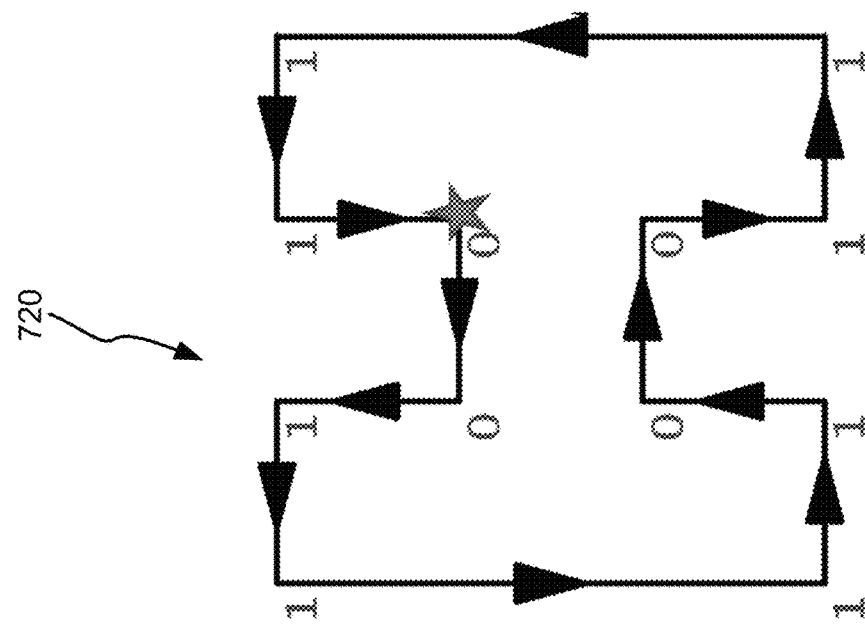
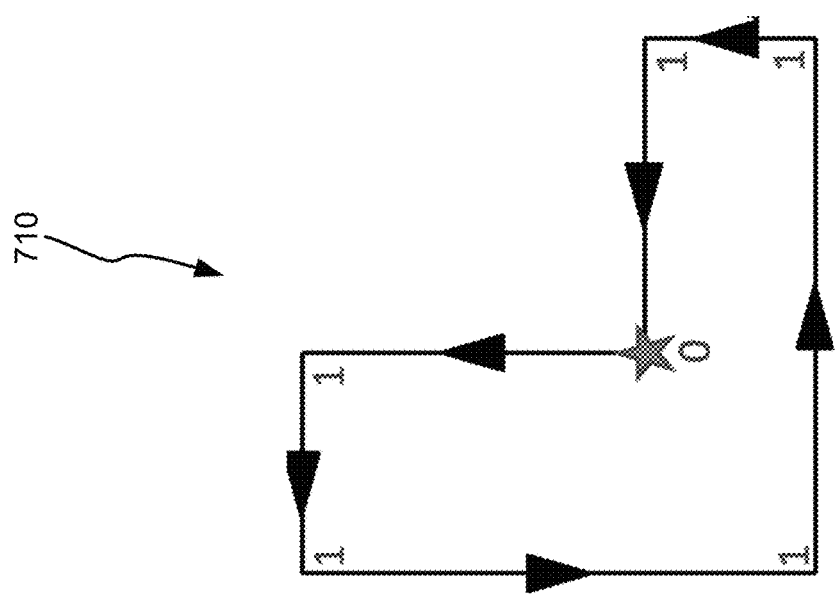
FIG. 7

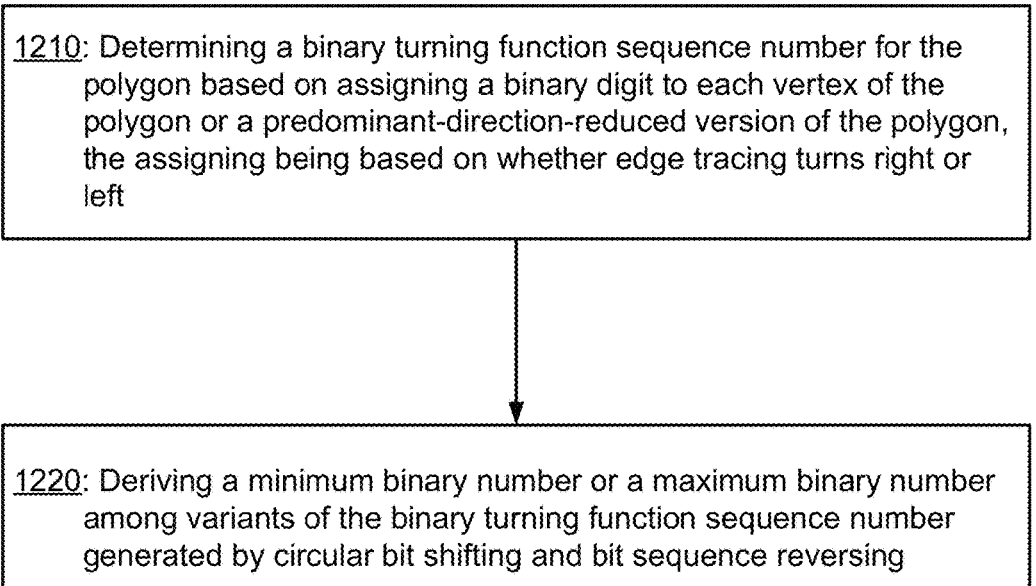
Flow chart
1200
FIG. 12

Flow chart
1300

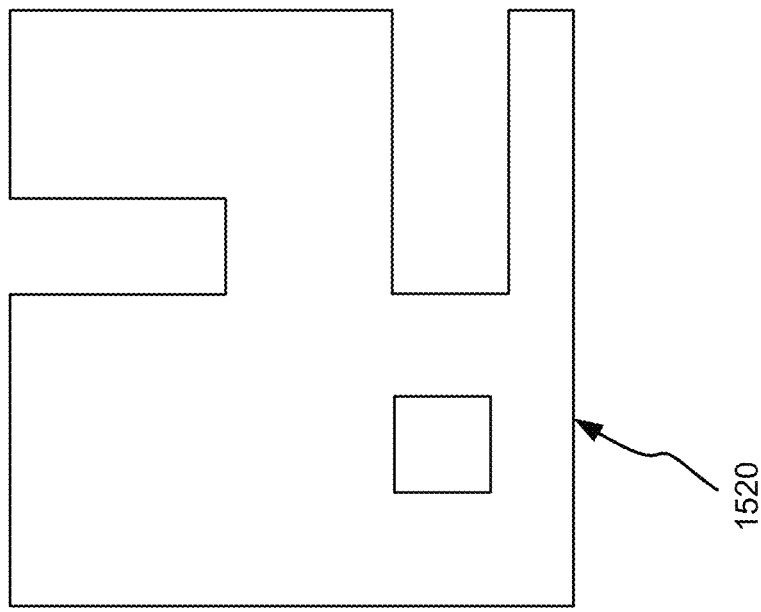
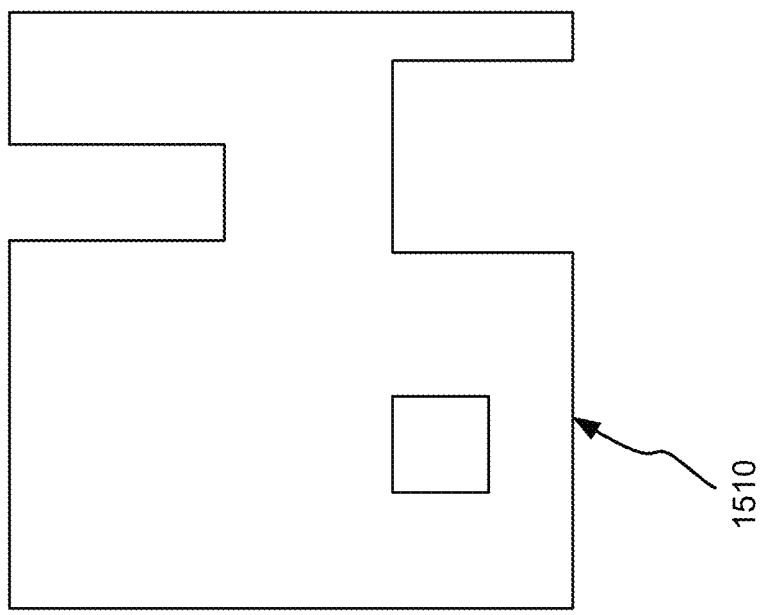
FIG. 15

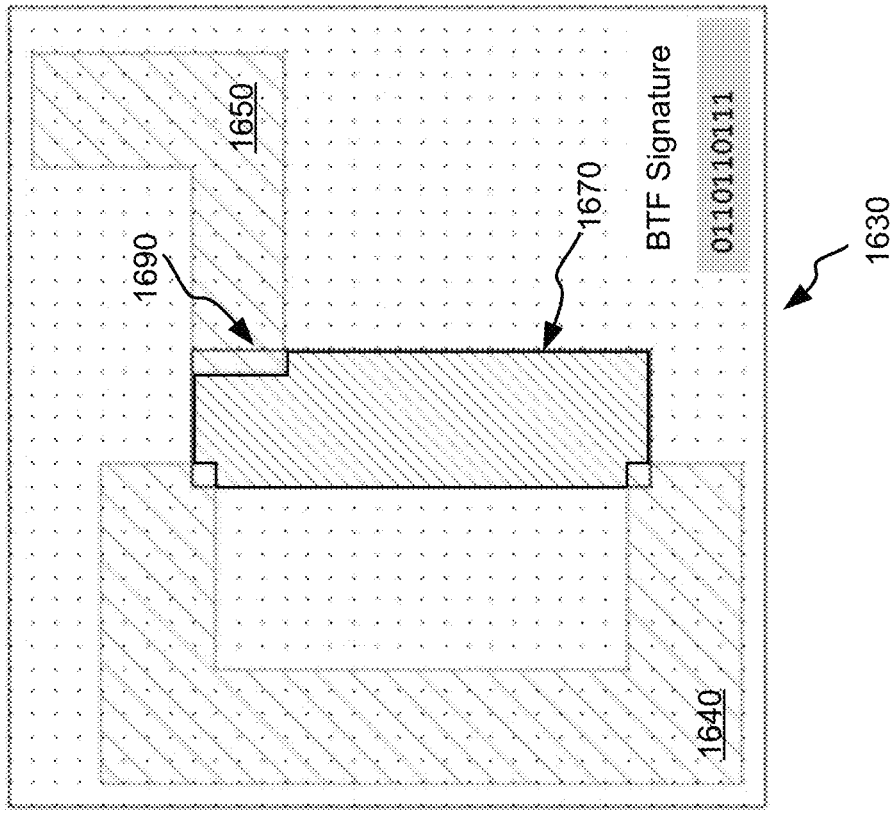
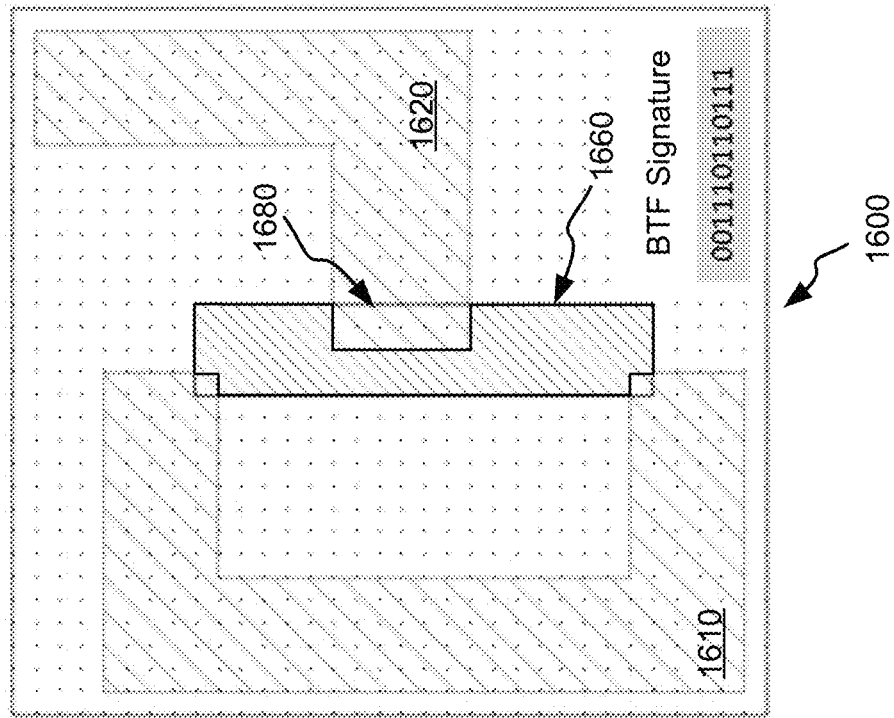
FIG. 16

LAYOUT PATTERN SIMILARITY DETERMINATION BASED ON BINARY TURNING FUNCTION SIGNATURES

RELATED APPLICATIONS

This application claims the benefit of U.S. Provisional Patent Application No. 62/700,680, filed on Jul. 19, 2018, and naming Navin Srivastava et al. as inventors, which application is incorporated entirely herein by reference.

FIELD OF THE DISCLOSED TECHNOLOGY

The present disclosed technology relates to the field of circuit design and manufacture. Various implementations of the disclosed technology may be particularly useful for layout pattern similarity determination.

BACKGROUND OF THE DISCLOSED TECHNOLOGY

For decades, design rules such as spacing, overlap and enclosure rules have been used to ensure that an integrated circuit, when fabricated, matches the designer's intent. As advanced technology nodes push the limits of geometric feature sizes on chips, as well as the limits of lithographic processes, more numerous and more complex rules are needed to ensure the correspondence between intent and implementation. In recent years, pattern (geometric configuration) matching as a tool to identify lithography hotspots has proven to be a compelling alternative to codifying complex design rules. When design verification requires the modeling of complex physical phenomena, pattern matching may be used to avoid repeating expensive simulations on the same sets of geometries. In many ways, pattern matching has become a mainstream tool in physical layout verification at advanced technology nodes.

While the ability to detect identical geometric configurations (exact matching) is a basic necessity, most pattern matching applications demand the ability to recognize "similar" configurations (fuzzy matching). FIGS. 3 and 4 show examples of layout patterns that are different but could be considered similar by some measures. Several practical considerations drive the need for better and more versatile fuzzy pattern matching techniques, such as managing vast libraries of layout configurations, predicting previously unseen hotspots from known configurations, and identifying similarities in post-OPC (optical proximity correction) layouts. The geometric shapes involved in a fuzzy pattern match may vary in size, location, or even topology. In some cases, the expected or allowed levels of variation (where and how much) for patterns to be deemed similar may be known a priori, but this is not generally the case. The definition of similarity also changes with the target application. Hence, modern pattern-matching tools need a variety of gauges to measure pattern similarity.

Most schemes on fuzzy pattern matching focus on the efficiency of matching algorithms and adapting them for fuzzy patterns. They begin with an exact specification of pattern features that ought to match, and add some tolerance to those pattern features to allow for fuzzy matches. For those relying on derived geometry features (such as pattern density or distance metrics based on a hash function), fuzziness takes the form of a numerical tolerance on a measured quantity, making it easy to quantify but hard to visualize. Moreover, these approaches must be tuned to specific applications, which reduces their versatility.

Some other approaches that use explicit geometry features (such as polygon vertices, edge lengths and spacings, or bitmap transforms, can capture fuzziness in a more visually meaningful way. Depending on the underlying pattern representation, they allow some uncertainty in the location of edges/vertices or allow a range of values for bitmap cell widths. However, the underlying pattern representation places limits on the nature as well as the scale of geometric variations that can be supported. For example, many state-of-the-art pattern matchers do not allow variations in the number of edges and vertices, and only work well with small perturbations in geometry size and location. Circumventing these limitations comes at the cost of information loss in weakly specified patterns, or slow computation. For example, most existing tools allow users to mask larger areas of uncertainty using "don't-care regions" in a pattern. However, don't care regions need to be predefined, so a user needs to know where to expect uncertainty, and how large the region should be.

BRIEF SUMMARY OF THE DISCLOSED TECHNOLOGY

Aspects of the disclosed technology relate to techniques of pattern-based resolution enhancement for lithography. In one aspect, there is a method comprising: receiving layout data of layout patterns; determining one or more binary turning function signatures for each of the layout patterns, the one or more binary turning function signatures comprising binary turning function signatures for polygons in the each of the layout patterns, determination of the binary turning function signature of a polygon comprising: determining a binary turning function sequence number for the polygon based on assigning a binary digit to each vertex of the polygon or each vertex of a predominant-direction-reduced version of the polygon, the assigning being based on whether edge tracing turns right or left, and deriving a minimum binary number or a maximum binary number among variants of the binary turning function sequence number generated by circular bit shifting and bit sequence reversing; determining similar layout patterns in the layout patterns based on the one or more binary turning function signatures; and storing information of the similar layout patterns in a computer-accessible medium.

The method may further comprise: processing some or all of the similar layout patterns, the processing comprising identifying hotspots based on the similar layout patterns, classifying the layout patterns based on the similar layout patterns, applying simulation results to the similar layout patterns, or applying OPC results to the similar layout patterns.

The one or more binary turning function signatures may further comprise one binary turning function signature for each of secondary polygons. The secondary polygons may comprise secondary polygons derived from pattern extents. Additionally or alternatively, the secondary polygons comprise secondary polygons derived based on polygons added to the layout patterns.

The predominant-direction-reduced version of the polygon may be generated through a process, the process comprising: determining predominant directions based on edge lengths and edge orientations of the polygon; and determining the predominant-direction-reduced version of the polygon based on the predominant directions.

The determining similar layout patterns may further be based on sizes of edges of the polygons in the each of the layout patterns.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 3 illustrates an example of three layout patterns that are different but could be considered similar by some measures.

FIG. 5 illustrates four different orientations of an 'L'-shaped polygon.

FIG. 7 illustrates an example of an 'L'-shape vs an 'H'-shape.

FIG. 12 illustrates a flowchart showing a process of binary turning function signature determination that may be implemented according to various examples of the disclosed technology.

FIG. 15 illustrates secondary polygons generated based on pattern extents for two of the layout patterns shown in FIG. 14.

FIG. 16 illustrates examples of generating secondary polygons via adding polygons that overlap primary layout polygons.

DETAILED DESCRIPTION OF THE DISCLOSED TECHNOLOGY

General Considerations

Figure 1:
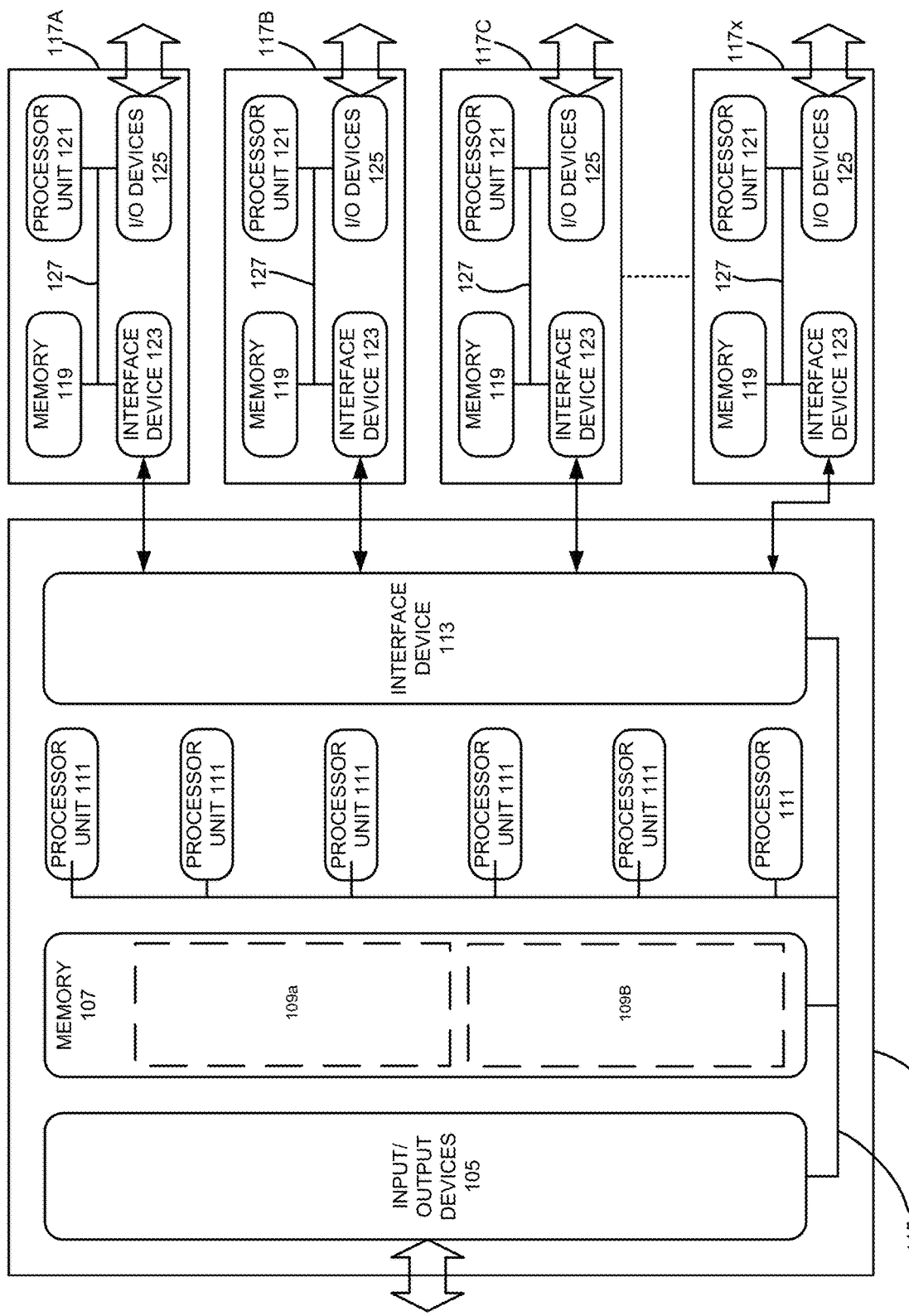
FIG. 1 illustrates an example of a computing system that may be used to implement various embodiments of the disclosed technology.

Various aspects of the present disclosed technology relate to techniques of binary turning function-based layout pattern similarity determination. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine", "derive", and "process" to describe the disclosed methods. Such terms are high-level descriptions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
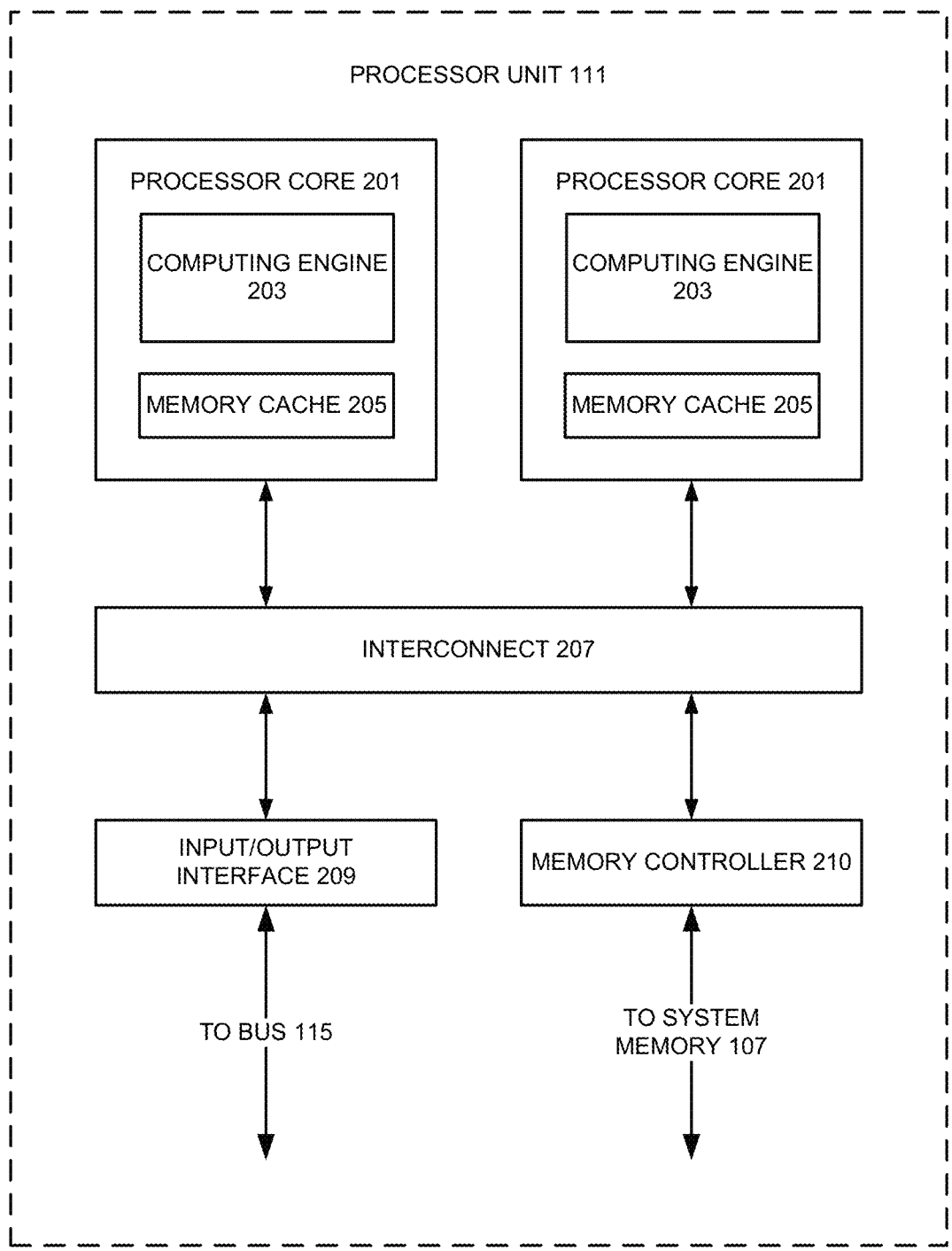
FIG. 2 illustrates an example of a multi-core processor unit that may be used to implement various embodiments of the disclosed technology.
Figure 4:
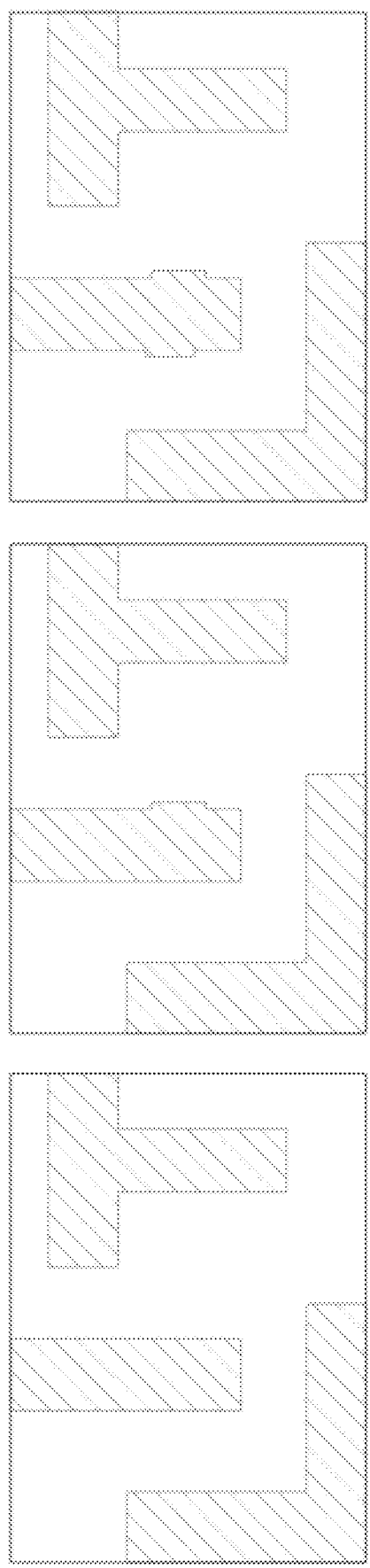
FIG. 4 illustrates another example of three layout patterns that are different but could be considered similar by some measures.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design Flow and Resolution Enhancement Techniques

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, automated place and route tools will be used to define the physical layouts, especially of wires that will be used to interconnect the circuit devices. Each layer of the microcircuit will have a corresponding layer representation in the layout design, and the geometric shapes described in a layer representation will define the relative locations of the circuit elements that will make up the circuit device. For example, shapes in the layer representation of a metal layer will define the locations of the metal wires used to connect the circuit devices. Custom layout editors, such as Mentor Graphics' IC Station or Cadence's Virtuoso, allow a designer to custom design the layout, which is mainly used for analog, mixed-signal, RF, and standard-cell designs.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Typically, a designer will perform a number of verification processes on the layout design. For example, the layout design may be analyzed to confirm that it accurately represents the circuit devices and their relationships described in the device design. In this process, a LVS (layout versus schematic) tool extracts a netlist from the layout design and compares it with the netlist taken from the circuit schematic. LVS can be augmented by formal equivalence checking, which checks whether two circuits perform exactly the same function without demanding isomorphism.

The layout design also may be analyzed to confirm that it complies with various design requirements, such as minimum spacings between geometric elements and minimum linewidths of geometric elements. In this process, a DRC (design rule checking) tool takes as input a layout in the GDSII standard format and a list of rules specific to the semiconductor process chosen for fabrication. A set of rules for a particular process is referred to as a run-set, rule deck, or just a deck. An example of the format of a rule deck is the Standard Verification Rule Format (SVRF) by Mentor Graphics Corporation.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a photomask (mask) must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the layout design onto the substrate. Adding to the difficulty associated with increasingly smaller feature size is the diffractive effects of light. As light illuminates the mask, the transmitted light diffracts at different angles in different regions of the mask. These effects often result in defects where the intended image is not accurately "printed" onto the substrate during the photolithographic process, creating flaws in the manufactured device.

To address this problem, one or more resolution enhancement techniques are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, radiation amplitude control, is often facilitated by modifying the layout design data employed to create the lithographic mask. One way to implement this technique, for example, is to adjust the edges of the geometric elements in the layout design so that the mask created from the modified layout data will control the radiation amplitude in a desired way during a lithographic process. The process of modifying the layout design data in this manner is often referred to as "optical proximity correction" or "optical process correction" (OPC).

Figure 8:
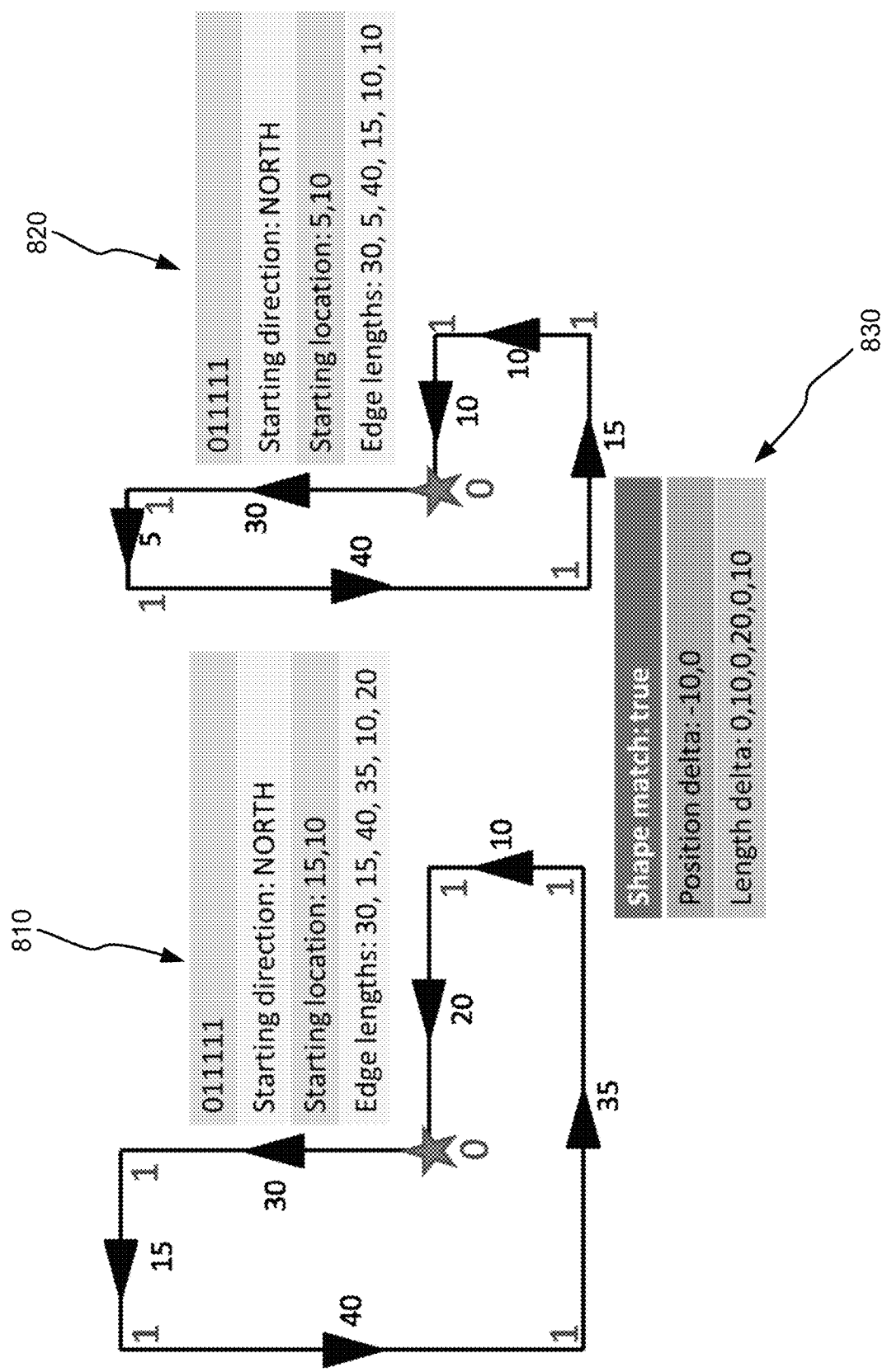
FIG. 8 illustrates an example of binary turning function-based representations for two L-shapes of different sizes.

As previously noted, a layout design is made up of a variety of geometric elements, which typically are polygons. In a conventional optical proximity correction process, the edges of these polygons are fragmented. More particularly, the individual edges of each polygon are divided into smaller sections, often referred to as edge segments or edge fragments. The size of the fragments and which particular edges are to be fragmented is dependent upon parameters of the optical proximity correction process. The fragmenting of edges facilitates the optical proximity correction process by allowing the edge segments to be rearranged or edited to realize the desired modifications. Additionally, geometric features that will increase the fidelity of the photolithographic process may be added to the design by moving or displacing the fragments. As such, OPC often introduces small indentations or protrusions (jogs) on layout geometries, as illustrated in FIG. 8.

Binary Turning Function Signatures

A layout pattern comprises geometry shapes (forming metallic or semiconducting circuit elements) and spaces between them (corresponding to isolating material such as dielectrics). Turning functions can be used to describe shapes based on tracing a polygon (or generally a curve) and tracking changes in direction at vertices (or tangent directions for a curve) along with the associated segment (or arc) lengths. The turning function of a polygon is thus a sequence of pairs of vertex angles and segment lengths.

A turning function can be reduced to a compact and convenient binary form for the Manhattan (right-angled)

shapes common in layout designs. Because the change in direction at any vertex is either +90° or −90° for Manhattan layout features, a binary digit can be assigned to each vertex depending on whether the polygon turns left or right at that vertex. It should be noted that either the convention of counterclockwise polygon traversal (clockwise for holes in a polygon) or the opposite way may be adopted and that turning right vs. left may be represented by either "0" vs. "1" or "1" vs. "0". Ignoring the edge lengths, a sequence of binary bits, referred to as a binary turning function sequence, can represent the shape of a Manhattan polygon.

Binary turning function sequences can be used to identify topographically similar polygons of any size quickly. FIG. 5 shows four different orientations of an 'L'-shaped polygon. According to some implementations of the disclosed technology, the binary turning function sequences for these four polygons are "111011", "111101", "111110", and "110111", respectively, derived by starting the tracing from the vertex with a star sign for each of the orientations.

Observe that these binary turning function sequences for different orientations are circularly shifted versions of each other. Since binary turning function sequences for different orientations of a shape are simply circularly shifted versions of each other, it follows that different orientations of a shape will have the same lexicographical-minimum (or lexicographical-maximum) binary turning function sequences. Hence, rotation-insensitive shape similarity can be quickly determined based on the minimum or maximum binary turning function sequence. Here, the minimum or maximum binary turning function sequence may serve as the binary turning function signature. In the example shown in FIG. 5, the 'L'-shaped polygon has a binary turning function signature of "011111" or "111110", corresponding to the minimum or maximum binary turning function sequence.

Figure 6:
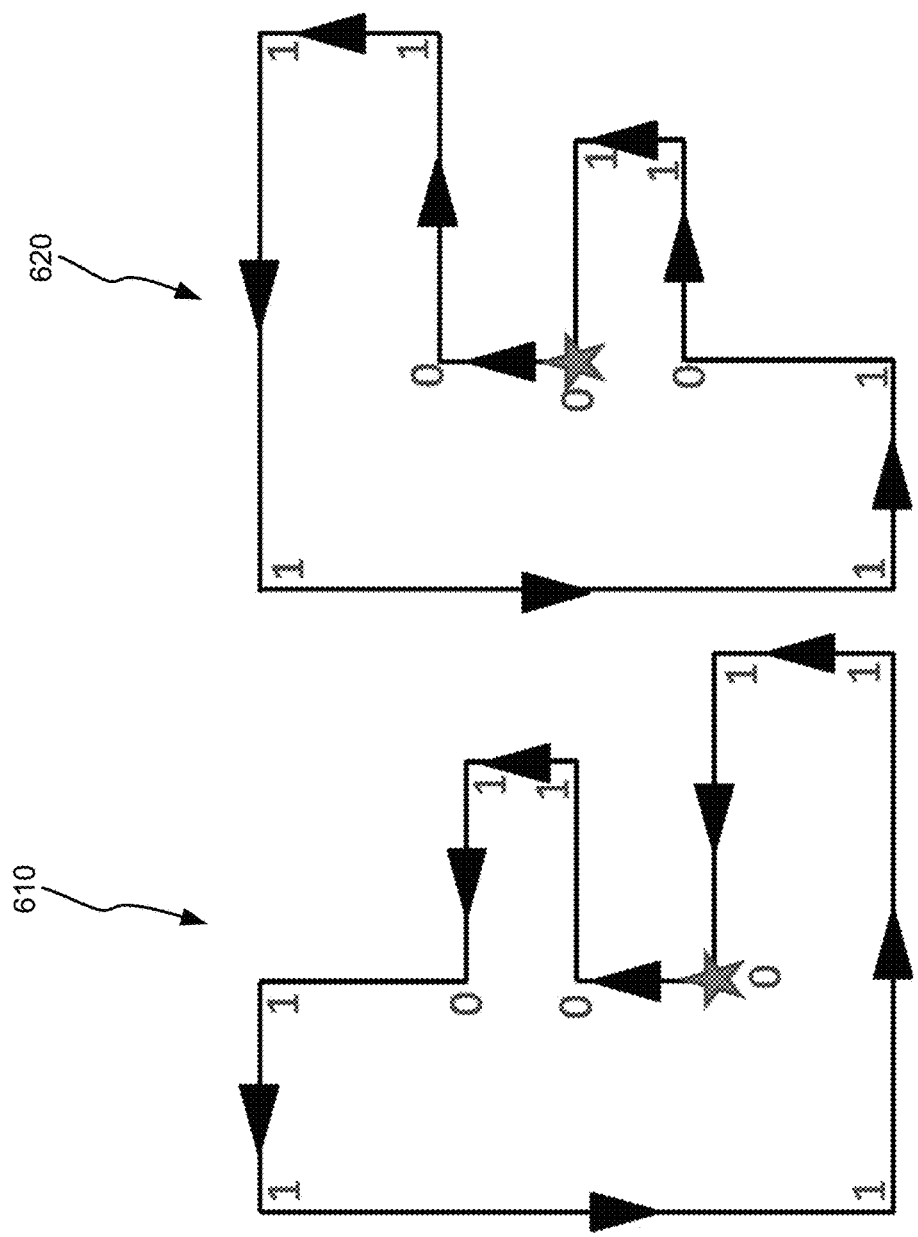
FIG. 6 illustrates an 'F'-shaped polygon and a mirror image of one of its rotational variants.

If a shape is flipped horizontally or vertically (mirror image), its min- (or max-) binary turning function sequence representation is not the same as that for the original shape. To classify mirror images of a layout shape into the same group as the layout group itself, the binary turning function sequence signature can be further defined as the minimum or maximum binary turning function sequence with respect to both polygon tracing directions. FIG. 6 illustrates an 'F'-shaped polygon and a mirror image of one of its rotational variants. The minimum binary turning function sequences with respect to the counter-clockwise tracing direction for the original polygon 610 and the mirror image 620 are "0011011111" and "0011111011", respectively. Reversing of "0011111011" leads to "1101111100". The minimum binary turning function sequence for "1101111100" is "0011011111", which is the same as the minimum binary turning function sequence for the original polygon 610. This shows the original polygon 610 and the mirror image 620 can be represented by the same binary turning function sequence signature if binary turning function sequences are compared with respect to not only circular bit shifting but also bit sequence reversing.

Topographically dissimilar shapes have different binary turning function signatures. FIG. 7 shows an example of an 'L'-shape vs an 'H'-shape. The 'L'-shape 710 has a binary turning function signature of "011111" whereas the 'H'-shape 720 has a binary turning function signature of "001111001111". Thus, binary turning function signatures can be used to quickly differentiate topographically dissimilar shapes irrespective of size.

If rotation/image-sensitivity is desirable, a combination of the binary turning function sequence signature, the starting vertex, and the tracing direction can capture all eight orientations of a right-angled polygon. Thus, the binary turning function sequence representation enables both identifying shape similarity irrespective of size and orientation and distinguishing different orientations of the same shape as needed.

The binary turning function signature may also be associated with the size information of a layout polygon to form a more complete representation. FIG. 8 illustrates an example of such binary turning function-based representations for two L-shapes of different sizes. Each of the binary turning function-based representations 810 and 820 comprises a binary turning function sequence signature, starting direction, starting (vertex) location, and edge lengths. The edge lengths can be used to constrain the sizes of polygons that constitute a similarity match. The starting vertex location provides an appropriate frame of reference (usually the pattern's frame of reference). This shape representation allows a full range of variations in orientation and size depending on the intended use. If similar shapes without regard to size need to be identified, the edge lengths will not play a role. If the objective is to identify similar shapes in any orientation, the binary turning function signature may be sufficient. To restrict similarity within certain size ranges, the edge lengths can be specified as min-max ranges instead of exact quantities.

Also shown in FIG. 8 is a simple similarity scoring function 830 to address the question of how similar two shapes are. If the two shapes have identical binary turning function signature, the relative displacement of their starting locations and the differences in edge lengths may serve as similarity scores. These scores are a quantitative measure of similarity between the two shapes.

As noted previously, some design processes such as optical proximity correction (OPC) often introduce small indentations or protrusions (jogs) on layout geometries. Since these modifications are very sensitive to the context (surrounding geometric configurations), layout shapes that are similar before OPC may appear quite different after OPC. In such cases, it may be necessary to ignore minor jogs in shapes to reveal underlying geometric similarities. A common way to achieve this is to "smooth" layout geometries—moving edges from their drawn locations so that jogs smaller than a certain dimension are eliminated. However, it is not always possible to determine the new location of a smoothed edge with certainty.

Predominant directions can capture the overall trajectory of a shape while ignoring jogs and leave the original pattern geometries undisturbed. A jog in a (horizontal or vertical) layout edge creates a small deviation perpendicular to the direction of the original edge. Thus, the original edge (e.g., edge before OPC) corresponding to a predominant direction can be determined based on comparing the total length of every other edges in one direction with that in the other direction. The original polygon can be converted to a predominant-direction-reduced version, which can be used for comparing shapes without the influence of jogs on the shapes.

Figure 9:
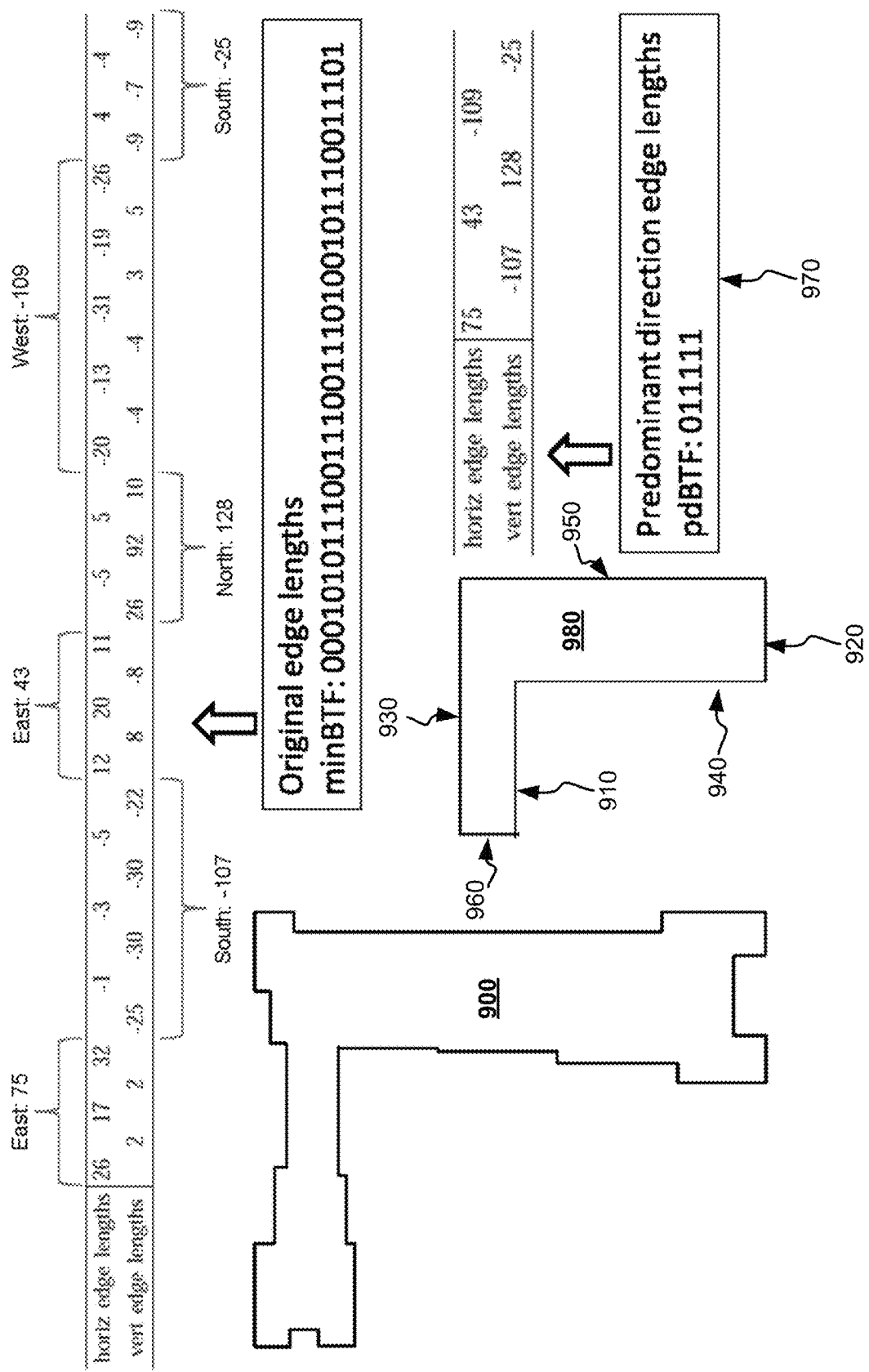
FIG. 9 illustrates an example of determining a predominant-direction-reduced version of a polygon and its binary turning function signature.

FIG. 9 illustrates an example of determining a predominant-direction-reduced version of a polygon and its binary turning function signature. For right-angled polygons, the sequence of edges in a polygon traversal alternates between horizontal (east/west) and vertical (north/south) edges of a polygon 900. The edge lengths can be converted to signed quantities based on the traversal direction at each edge—east/north (positive) or west/south (negative), for example. Consider the case in which the odd occurrences ($l_h$: h∈2Z+1) correspond to horizontal edges, and even occurrences ($l_v$:

v∈2Z) correspond to vertical ones. To find the predominantly horizontal edges, all horizontal edge length sequences ($l_i \ldots l_j$: $i \ldots j \in 2Z+1$) that have the same sign may first be identified: $l_i \ldots l_j > 0$ (eastward) or $l_i \ldots l_j < 0$ (westward). For each such sequence, the horizontal edge lengths are aggregated, $\sigma_h = \Sigma_{h=1}^{h=j} l_h$: $h \in 2Z+1$, as well as the intervening vertical edge lengths $\sigma_v = \Sigma_{h=i+1}^{h=j-1} l_v$: $h \in 2Z$. If $v \ll h$, the sequence $l_i \ldots l_j$: $i \ldots j \in 2Z$ represents a predominantly horizontal edge whose overall length and direction is given by h. The example in FIG. 9 shows three such horizontal sequences 910, 920, and 930 with h=75, 43, and −109, respectively. A similar procedure is repeated to find the predominantly vertical edges 940, 950, and 960 with v=−107, 128, and −25, respectively.

Each predominantly horizontal or vertical sequence is then collapsed into a single edge using the corresponding value of $\sigma_h$ or $\sigma_v$. These derived edges form a predominant-direction-reduced version 980 of the polygon 900. FIG. 8 shows a binary turning function sequence 970 generated for the predominant-direction-reduced version 980, effectively capturing the overall shape of the complex polygon 900. Therefore, the binary turning function sequence 970 can serve as the binary turning function signature of the polygon 900.

Layout Pattern Tool

Figure 10:
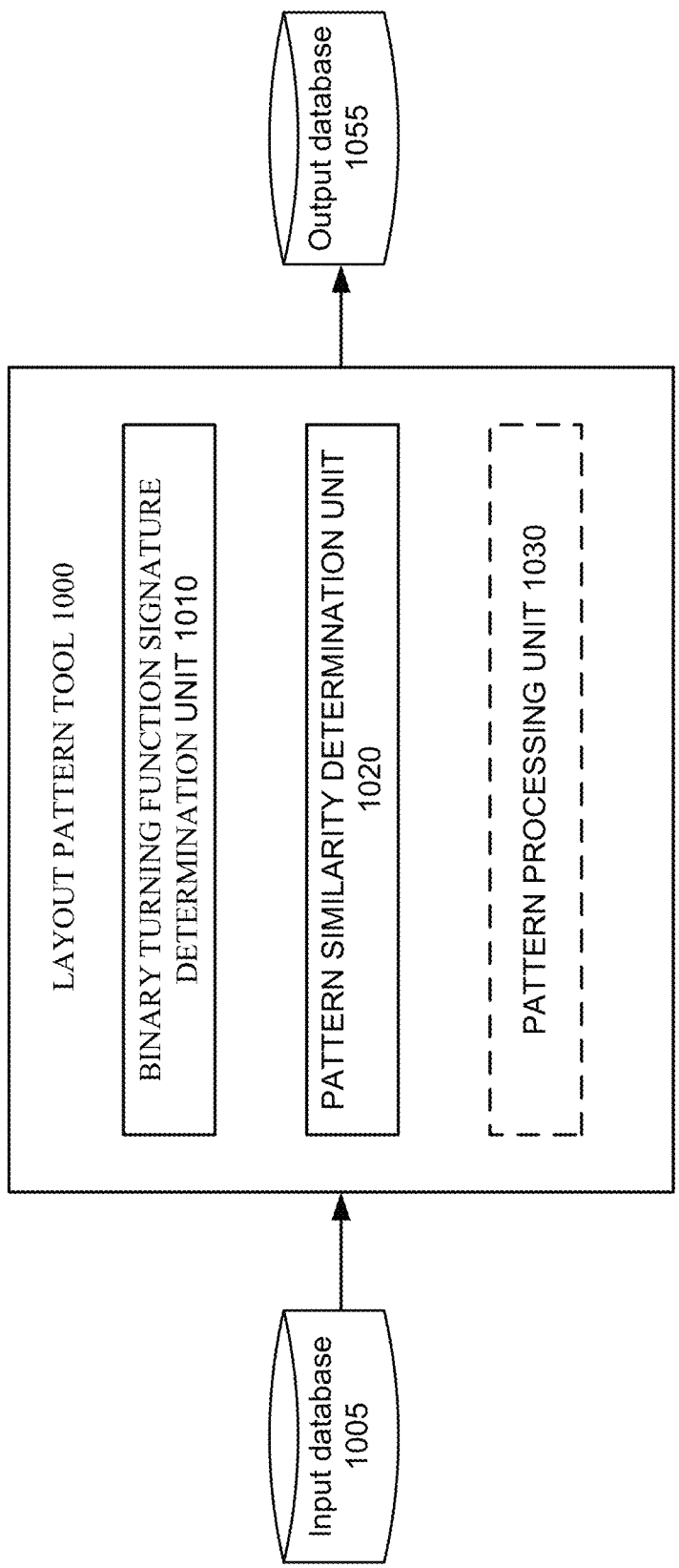
FIG. 10 illustrates an example of a layout pattern tool that may be implemented according to various embodiments of the disclosed technology.

FIG. 10 illustrates an example of a layout pattern tool 1000 that may be implemented according to various embodiments of the disclosed technology. As seen in this figure, the layout pattern tool 1000 includes a binary turning function signature determination unit 1010 and a pattern similarity determination unit 1020. Some implementations of the layout pattern tool 1000 may cooperate with (or incorporate) one or more of a pattern processing unit 1030, an input database 1005 and an output database 1055.

As will be discussed in more detail below, the layout pattern tool 1000 receives layout data of layout patterns from the input database 1005. The binary turning function signature determination unit 1010 determines one or more binary turning function signatures for each of the layout patterns. Here, the one or more binary turning function signatures comprise binary turning function signatures for polygons in the each of the layout patterns. The determination of the binary turning function signature of a polygon comprises: determining a binary turning function sequence number for the polygon based on assigning a binary digit to each vertex of the polygon or each vertex of a predominant-direction-reduced version of the polygon, the assigning being based on whether edge tracing turns right or left, and deriving a minimum binary number or a maximum binary number among variants of the binary turning function sequence number generated by circular bit shifting and bit sequence reversing.

Based on the one or more binary turning function signatures, the pattern similarity determination unit 1020 determines similar layout patterns in the layout patterns. The layout pattern tool 1000 stores information of the similar layout patterns in the output database 1055. The pattern processing unit 1030 can process some or all of the similar layout patterns, the processing comprising identifying hotspots based on the similar layout patterns, classifying the layout patterns based on the similar layout patterns, applying simulation results to the similar layout patterns, or applying OPC results to the similar layout patterns.

As previously noted, various examples of the disclosed technology may be implemented by one or more computing systems, such as the computing system illustrated in FIGS. 1 and 2. Accordingly, one or more of the binary turning function signature determination unit 1010, the pattern similarity determination unit 1020, and the pattern processing unit 1030 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the binary turning function signature determination unit 1010, the pattern similarity determination unit 1020, and the pattern processing unit 1030. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the binary turning function signature determination unit 1010, the pattern similarity determination unit 1020, and the pattern processing unit 1030 are shown as separate units in FIG. 10, a single computer (or a single processor within a master computer) or a single computer system may be used to implement some or all of these units at different times, or components of these units at different times.

With various examples of the disclosed technology, the input database 1005 and the output database 1055 may be implemented using any suitable computer readable storage device. That is, either of the input database 1005 and the output database 1055 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 1005 and the output database 1055 are shown as separate units in FIG. 10, a single data storage medium may be used to implement some or all of these databases.

Binary Turning Function Based Layout Pattern Similarity Determination

Figure 11:
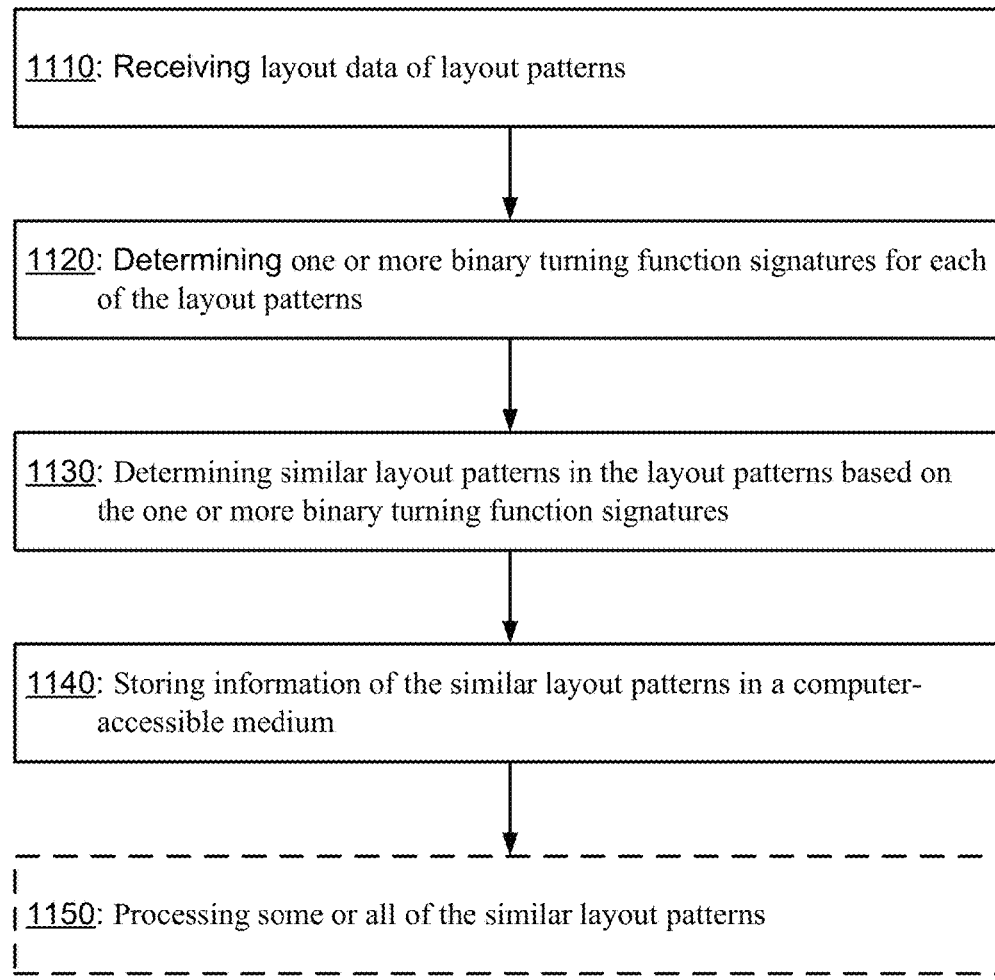
FIG. 11 illustrates a flowchart showing a process of binary turning function-based layout pattern similarity determination that may be implemented according to various examples of the disclosed technology.

FIG. 11 illustrates a flowchart 1100 showing a process of binary turning function-based layout pattern similarity determination that may be implemented according to various examples of the disclosed technology. For ease of understanding, methods of binary turning function-based layout pattern similarity determination that may be employed according to various embodiments of the disclosed technology will be described with reference to the layout pattern tool 1000 in FIG. 10 and the flow chart 1100 illustrated in FIG. 11. It should be appreciated, however, that alternate implementations of a layout pattern tool may be used to perform the methods of binary turning function-based layout pattern similarity determination illustrated by the flow chart 1100 according to various embodiments of the disclosed technology. Likewise, the layout pattern tool 1000 may be employed to perform other methods of binary turning function-based layout pattern similarity determination according to various embodiments of the disclosed technology.

In operation 1110 of the flow chart 1100, the layout pattern tool 1000 receives layout data of layout patterns from the input database 405. The layout patterns may be extracted from one or more layout designs or created using various methods. The one or more layout designs may be in the GDSII standard format.

In operation 1120, the binary turning function signature determination unit 1010 determines one or more binary turning function signatures for each of the layout patterns. The one or more binary turning function signatures comprise binary turning function signatures for polygons in each of the layout patterns. FIG. 12 illustrates a flowchart 1200 showing a process of binary turning function signature determination that may be implemented according to various examples of the disclosed technology.

In operation 1210 of the flowchart 1200, the binary turning function signature determination unit 1010 determines a binary turning function sequence number for the polygon. If the polygon is a normal one and does not have small indentations or protrusions (jogs) which may be introduced, for example, by OPC, the binary turning function signature determination unit 1010 can assign a binary digit to each vertex of the polygon based on whether edge tracing turns right or left. FIGS. 5-8 show examples of determining binary turning function sequence numbers based on assigning binary digits to vertices according to some embodiments of the disclosed technology. The assigned binary digits for each of the polygons form a binary turning function sequence number for the each of the polygons.

Figure 13:
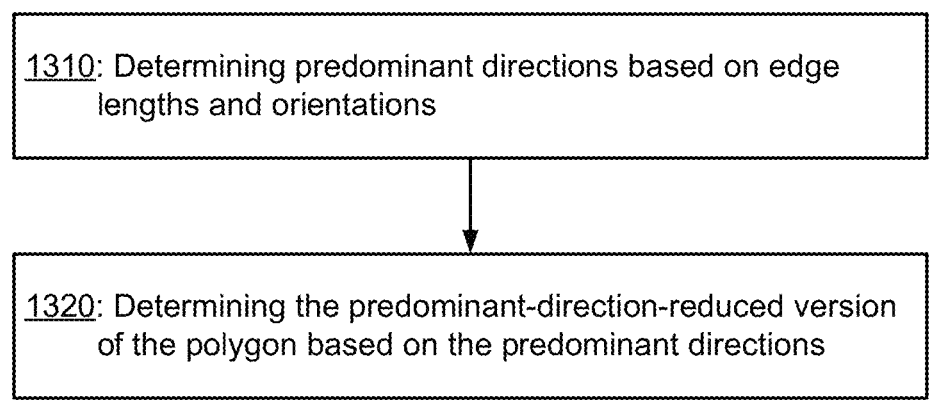
FIG. 13 illustrates a flowchart showing a process of determining a binary turning function sequence number for a predominant-direction-reduced version of a polygon according to various implementations of the disclosed technology.

If the polygon has small indentations or protrusions (jogs) like a polygon 900 shown in FIG. 9, the binary turning function signature determination unit 1010 can use the process illustrated by a flowchart 1300 shown in FIG. 13 to determine a binary turning function sequence number for a predominant-direction-reduced version of the polygon according to various implementations of the disclosed technology. In operation 1310 of the flowchart 1300, the binary turning function signature determination unit 1010 determines predominant directions based on edge lengths and edge orientations of the polygon. One example of the predominant direction determination according to some embodiments of the disclosed technology is illustrated in FIG. 9. In operation 1320, the binary turning function signature determination unit 1010 determines a predominant-direction-reduced version of the polygon based on the predominant directions. In FIG. 9, the polygon 980 is the predominant-direction-reduced version of the polygon 900. Then, the polygon 980 can be used to derive a binary turning function sequence number for the polygon 900.

Refer back to the flowchart 1200. In operation 1220, the binary turning function signature determination unit 1010 derives a minimum binary number or a maximum binary number among variants of the binary turning function sequence number generated by circular bit shifting and bit sequence reversing. As discussed previously, performing circular bit shifting and bit sequence reversing on the binary turning function sequence number generates binary turning function sequence numbers for rotational and image variants of the polygon. The minimum binary number or the maximum binary number can serve as the binary turning function signature of the polygon.

Figure 14:
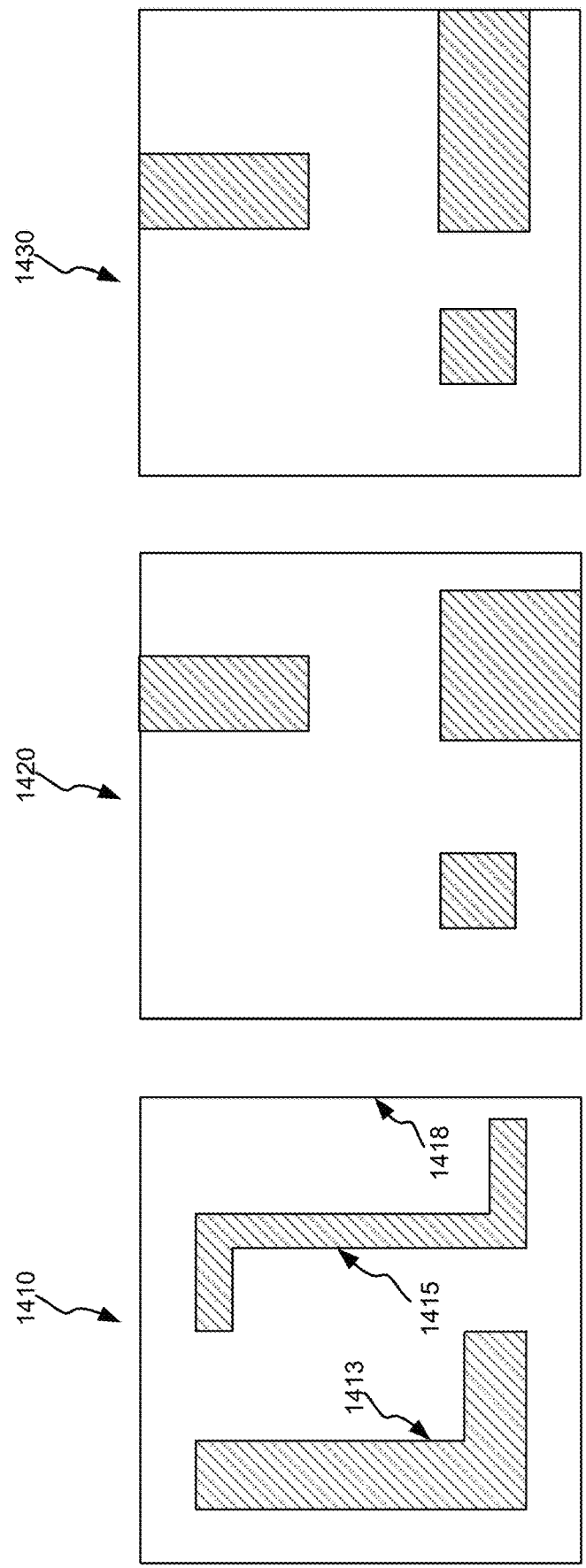
FIG. 14 illustrates three layout patterns for pattern representation and secondary polygon generation.

Typically, the polygons of a layout pattern are obtained by clipping a large layout to a window (an extent polygon). A pattern thus can have two types of polygons—the pattern shapes themselves in the desired configuration, and an extent polygon that circumscribes the pattern polygons as well as any empty space. FIG. 14 illustrates three layout patterns 1410, 1420 and 1430. Note that the orientations of individual polygons in a pattern are fixed with respect to the pattern. While the pattern itself can be rotated to obtain different orientations, the individual polygons follow the overall orientation of the pattern. In the pattern 1410, an L-shape 1413 has a binary turning function signature of 011111, a starting location at (15, 15), and an east starting direction; a Z-shape 1415 has a binary turning function signature of 01110111, a starting location at (45, 10), and a north starting direction; and the extent polygon 1418 has a binary turning function signature of 1111, a starting location at (0, 0), and an east starting direction. The binary turning function signatures can capture shape features while allowing maximum flexibility in terms of specific edge lengths and vertex locations.

To capture important features of the relative arrangement of polygons without relying on specific coordinates, the binary turning function signature determination unit 1010 can further determine binary turning function signatures for secondary polygons. A secondary polygon is not one of primary layout polygons, but interacts with them and thus can provide relative placement information of primary layout polygons. One example of a secondary polygon is one obtained by subtracting the pattern shapes from the pattern extent. This can be achieved by using a boolean AND followed by a boolean NOT operation. FIG. 15 illustrates two polygons 1510 and 1520, which are secondary polygons generated in such a way for the two layout patterns 1420 and 1430, respectively.

Alternatively or additionally, secondary polygons can be generated by adding one or more polygons overlapping primary layout polygons and then subtracting the overlap portions from the one or more polygons. FIG. 16 illustrates two such secondary polygons 1660 and 1670 for two layout patterns 1600 and 1630, respectively. The line-end of an 'L' shape 1620 in the pattern 1600 vertically overlaps the concave space between the two ends of the 'C' shape 1610 in the pattern 1600, whereas the second pattern 1630 requires a vertical overlap between the line-ends of the 'C' shape 1610 and the 'L' shape 1640. A rectangle shape is drawn over each of the patterns (1680 over the pattern 1600, 1690 over the pattern 1630) such that the relative placement of pattern shapes overlapping it determines pattern similarity. The binary turning function signature determination unit 1010 can then subtract the overlapping portions to derive the secondary polygons 1660 and 1670 for the layout patterns 1600 and 1630, respectively.

Refer back to the flowchart 1100. In operation 1130, the pattern similarity determination unit 1020 determines similar layout patterns in the layout patterns based on the one or more binary turning function signatures. The comparison of the binary turning function signatures for the layout shapes determines individual layout polygon similarity, allowing maximum uncertainty in specific edge lengths and vertex locations. The comparison of the binary turning function signatures for the secondary polygons can further capture the relative placement of the layout polygons, and to some extent topology. The two layout patterns 1420 and 1430 shown in FIG. 14 contain similar shapes, differing only in that one of the shapes abuts a different edge of the pattern extent. This difference is reflected by the different binary turning function signatures for the two corresponding secondary polygons 1510 and 1520, "001111001111" (+ hole "0000") vs. "001111100111" (+ hole "0000").

Similarly, the two layout patterns 1600 and 1630 shown in FIG. 16 contain similar shapes (a C shape and an L shape), differing only in the relative placement of the two layout polygons as noted previously. This difference is reflected by the different binary turning function signatures for the two corresponding secondary polygons 1660 and 1670, "001110110111" vs. "0110110111".

The pattern similarity determination unit 1020 may use some or all of the one or more binary turning function signatures to determine the similarity. The pattern similarity determination unit 1020 may determine similar layout patterns in the layout patterns based further on sizes of edges of the polygons in the in the each of the layout patterns. The edge lengths can be used to constrain the sizes of polygons within predetermined ranges that constitute a similarity match.

In operation 1140, the layout pattern tool 1000 stores information of the similar layout patterns in the output database 1055. Optionally, the pattern processing unit 1030 processes some or all of the similar layout patterns. The processing comprising identifying hotspots based on the similar layout patterns, classifying the layout patterns based on the similar layout patterns, applying simulation results to the similar layout patterns, or applying OPC results to the similar layout patterns.

Figure 17:
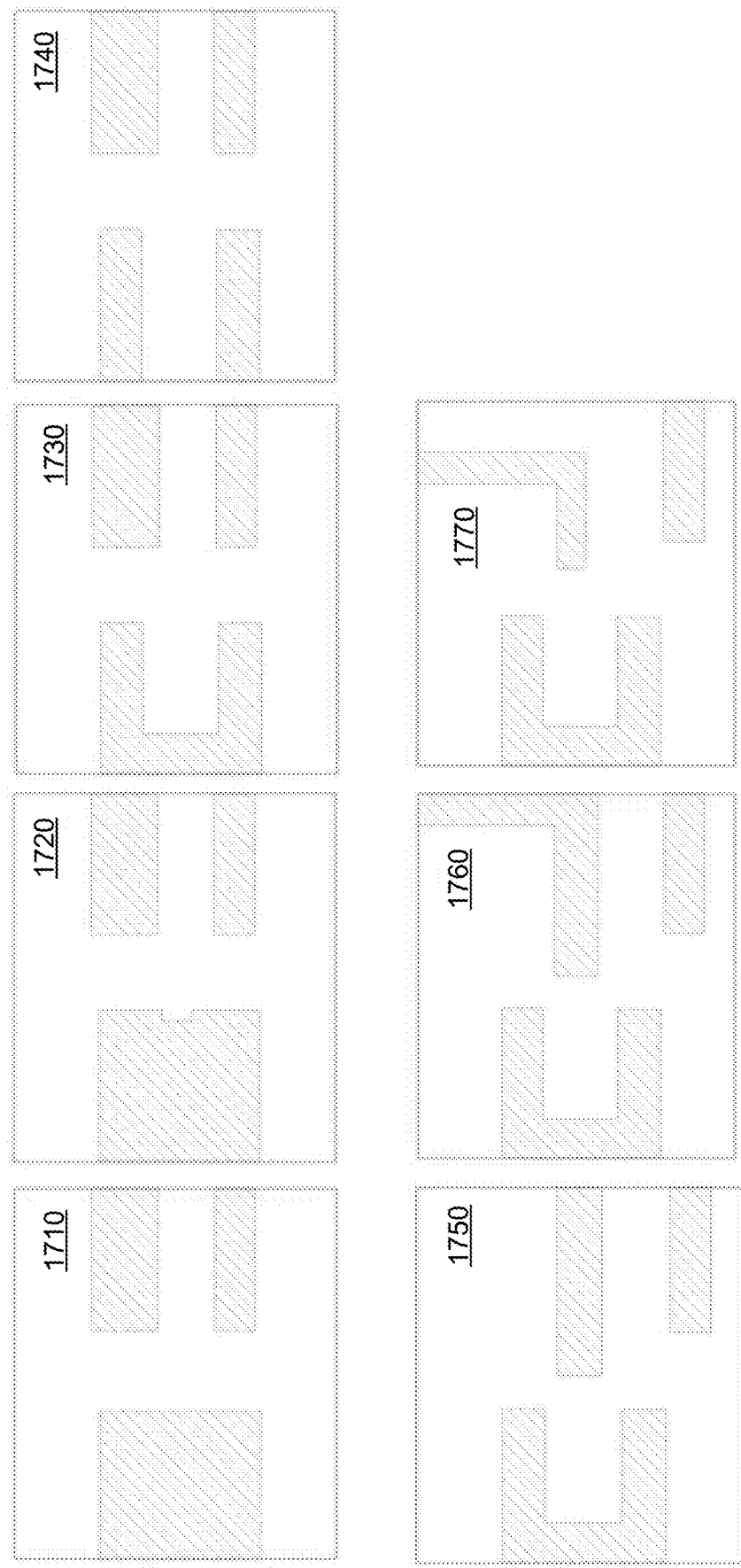
FIG. 17 illustrates seven layout patterns for demonstrating different layout pattern groupings.

FIG. 17 illustrates seven layout patterns 1710-1770. If the binary turning function signatures for the original layout shapes are used alone, the layout pattern tool 1000 can classify these patterns into four groups: 1710, (1720, 1730, and 1750), 1740, and (1760, 1770). If predominant-direction-reduced versions of the polygons are considered, a different set of four groups are obtained: (1710, 1720), (1730, 1750), 1740, and (1760, 1770). If the binary turning function signature for a secondary polygon derived based on the pattern extent is used alone, the layout pattern tool 1000 can classify these patterns into three groups: 1710, (1720-1760), and 1770.

Conclusion

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:
   receiving layout data of layout patterns;
   determining one or more binary turning function signatures for each of the layout patterns, the one or more binary turning function signatures comprising binary turning function signatures for polygons in the each of the layout patterns, determination of the binary turning function signature of a polygon comprising:
      determining a binary turning function sequence number for the polygon based on assigning a binary digit to each vertex of the polygon or each vertex of a predominant-direction-reduced version of the polygon, the assigning being based on whether edge tracing turns right or left, and
      deriving a minimum binary number or a maximum binary number among variants of the binary turning function sequence number generated by circular bit shifting and bit sequence reversing;
   determining similar layout patterns in the layout patterns based on the one or more binary turning function signatures; and
   storing information of the similar layout patterns in a non-transitory computer-accessible medium.

2. The method recited in claim 1, further comprising:
   processing some or all of the similar layout patterns, the processing comprising identifying hotspots based on the similar layout patterns, classifying the layout patterns based on the similar layout patterns, applying simulation results to the similar layout patterns, or applying OPC results to the similar layout patterns.

3. The method recited in claim 1, wherein the one or more binary turning function signatures further comprise one binary turning function signature for each of secondary polygons.

4. The method recited in claim 3, wherein the secondary polygons comprise secondary polygons derived from pattern extents.

5. The method recited in claim 3, wherein the secondary polygons comprise secondary polygons derived based on polygons added to the layout patterns.

6. The method recited in claim 1, wherein the predominant-direction-reduced version of the polygon is generated through a process, the process comprising:
   determining predominant directions based on edge lengths and edge orientations of the polygon; and
   determining the predominant-direction-reduced version of the polygon based on the predominant directions.

7. The method recited in claim 1, wherein the determining similar layout patterns is further based on sizes of edges of the polygons in the each of the layout patterns.

8. One or more non-transitory computer-readable media storing computer-executable instructions for causing one or more processors to perform a method, the method comprising:
   receiving layout data of layout patterns;
   determining one or more binary turning function signatures for each of the layout patterns, the one or more binary turning function signatures comprising binary turning function signatures for polygons in the each of the layout patterns, determination of the binary turning function signature of a polygon comprising:
      determining a binary turning function sequence number for the polygon based on assigning a binary digit to each vertex of the polygon or each vertex of a predominant-direction-reduced version of the polygon, the assigning being based on whether edge tracing turns right or left, and
      deriving a minimum binary number or a maximum binary number among variants of the binary turning function sequence number generated by circular bit shifting and bit sequence reversing;
   determining similar layout patterns in the layout patterns based on the one or more binary turning function signatures; and
   storing information of the similar layout patterns in a non-transitory computer-accessible medium.

9. The one or more non-transitory computer-readable media recited in claim 8, wherein the method further comprises:
   processing some or all of the similar layout patterns, the processing comprising identifying hotspots based on the similar layout patterns, classifying the layout patterns based on the similar layout patterns, applying simulation results to the similar layout patterns, or applying OPC results to the similar layout patterns.

10. The one or more non-transitory computer-readable media recited in claim 8, wherein the one or more binary turning function signatures further comprise one binary turning function signature for each of secondary polygons.

11. The one or more non-transitory computer-readable media recited in claim 10, wherein the secondary polygons comprise secondary polygons derived from pattern extents.

12. The one or more non-transitory computer-readable media recited in claim 10, wherein the secondary polygons comprise secondary polygons derived from pattern extents.

13. The one or more non-transitory computer-readable media recited in claim 8, wherein the predominant-direction-reduced version of the polygon is generated through a process, the process comprising:
  determining predominant directions based on edge lengths and edge orientations of the polygon; and
  determining the predominant-direction-reduced version of the polygon based on the predominant directions.

14. The one or more non-transitory computer-readable media recited in claim 8, wherein the determining similar layout patterns is further based on sizes of edges of the polygons in the each of the layout patterns.

15. A system, comprising:
  one or more processors, the one or more processors programmed to perform a method, the method comprising:
  receiving layout data of layout patterns;
  determining one or more binary turning function signatures for each of the layout patterns, the one or more binary turning function signatures comprising binary turning function signatures for polygons in the each of the layout patterns, determination of the binary turning function signature of a polygon comprising:
    determining a binary turning function sequence number for the polygon based on assigning a binary digit to each vertex of the polygon or each vertex of a predominant-direction-reduced version of the polygon, the assigning being based on whether edge tracing turns right or left, and
    deriving a minimum binary number or a maximum binary number among variants of the binary turning function sequence number generated by circular bit shifting and bit sequence reversing;
  determining similar layout patterns in the layout patterns based on the one or more binary turning function signatures; and
  storing information of the similar layout patterns in a non-transitory computer-accessible medium.

16. The system recited in claim 15, wherein the method further comprises:
  processing some or all of the similar layout patterns, the processing comprising identifying hotspots based on the similar layout patterns, classifying the layout patterns based on the similar layout patterns, applying simulation results to the similar layout patterns, or applying OPC results to the similar layout patterns.

17. The system recited in claim 15, wherein the one or more binary turning function signatures further comprise one binary turning function signature for each of secondary polygons.

18. The system recited in claim 17, wherein the secondary polygons comprise secondary polygons derived from pattern extents.

19. The system recited in claim 17, wherein the secondary polygons comprise secondary polygons derived from pattern extents.

20. The system recited in claim 15, wherein the predominant-direction-reduced version of the polygon is generated through a process, the process comprising:
  determining predominant directions based on edge lengths and edge orientations of the polygon; and
  determining the predominant-direction-reduced version of the polygon based on the predominant directions.

* * * * *